United States Patent [19]
Kobayashi et al.

[11] Patent Number: 6,149,966
[45] Date of Patent: Nov. 21, 2000

[54] COMPOSITION AND PROCESS FOR FORMING ELECTRICALLY INSULATING THIN FILMS

[75] Inventors: Akihiko Kobayashi; Katsutoshi Mine; Takashi Nakamura; Motoshi Sasaki; Kiyotaka Sawa, all of Chiba Prefecture, Japan

[73] Assignee: Dow Corning Toray Silicone Co., Ltd., Tokyo, Japan

[21] Appl. No.: 09/120,384

[22] Filed: Mar. 31, 1998

[30] Foreign Application Priority Data

Mar. 31, 1997 [JP] Japan ..................... 9-096476

[51] Int. Cl.⁷ ................. B05D 3/02; B05D 5/12
[52] U.S. Cl. .............. 427/58; 427/226; 427/245; 427/387
[58] Field of Search .................. 427/58, 385.5, 427/226, 245, 387

[56] References Cited

U.S. PATENT DOCUMENTS

| | | | |
|---|---|---|---|
| 3,615,272 | 10/1971 | Collins et al. | 23/366 |
| 4,756,977 | 7/1988 | Haluska et al. | 428/704 |
| 5,238,787 | 8/1993 | Haluska et al. | 430/325 |
| 5,416,190 | 5/1995 | Mine et al. | 528/492 |
| 5,548,159 | 8/1996 | Jeng | 257/634 |

FOREIGN PATENT DOCUMENTS

| | | |
|---|---|---|
| 0 492 826 A2 | 7/1992 | European Pat. Off. . |
| 0 736 584 A2 | 10/1996 | European Pat. Off. . |
| 59-189126 | 10/1984 | Japan . |
| 60-042426 | 6/1985 | Japan . |

OTHER PUBLICATIONS

Pg. 116 of the 1995 Proceedings of the Twelfth International VLSI Multilevel Interconnected Conference, Jun. 1995.

*Primary Examiner*—Erma Cameron
*Attorney, Agent, or Firm*—Sharon K. Severance; Roger E. Gobrogge; Rick D. Streu

[57] ABSTRACT

To provide a composition and process for forming insulating films that can produce insulating films having low dielectric constants. The composition comprises (A) an electrically insulating curable inorganic or organic resin, (B) a solvent, and (C) at least one solvent-soluble substance (excluding the solvent used for component (B)) that upon heating or by interaction with the resin (A) can generate gas or undergo volatilization in the temperature range from 0° C. to 800° C. The insulating films are prepared by coating the surface of a substrate the composition; evaporating the solvent; and subsequently heating the substrate in order to generate gas from component (C) during the course of or after the cure of the said resin (A).

20 Claims, No Drawings

COMPOSITION AND PROCESS FOR FORMING ELECTRICALLY INSULATING THIN FILMS

FIELD OF THE INVENTION

This invention relates to a composition for the formation of electrically insulating thin films and to a process for the formation of electrically insulating thin films. More particularly, this invention relates to a composition and process for the formation of insulating thin films that have low dielectric constants.

BACKGROUND OF THE INVENTION

Insulating thin films of silica are known for use as protective layers and as electrically insulating layers in electronic devices. The wet-coating of compositions comprising resin and solvent is generally and widely employed in this field. For example, U.S. Pat. No. 4,756,977 teaches a process for coating electronic devices with a silica thin film by applying a solvent solution of hydrogen silsesquioxane resin on a substrate, evaporating the solvent, and then heating at temperatures of 150° C. to 1,000° C. to effect conversion into ceramic-like silica.

Lower dielectric constants have been required from these insulating layers as devices have shrunk in size and become more highly integrated. For example, a dielectric constant of 2.7 has been reported for a thin film afforded by the cure of hydrogen silsesquioxane resin, 43rd Extended Abstracts of the Japan Society of Applied Physics and Related Societies, page 654, Abstract 26a-N-6. However, dielectric constants below 2.7 are required of the electrically insulating thin films in the next-generation highly integrated circuits with design rules narrower than 0.18 μm. To date no process has been discovered for the stable and highly reproducible generation of such low dielectric constants in the electrically insulating thin films suitable for highly integrated circuits, for example, in silica films.

On the other hand, it is generally known that the dielectric constant of an insulating thin film can be reduced by executing the thin film as a porous structure. For example, U.S. Pat. No. 5,548,159 has reported the formation of an insulating thin film with a porous structure through the use of the baked product of hydrogen silsesquioxane resin as the dielectric layer in a highly integrated circuit. This patent, however, does not disclose a specific method for the formation of the porous structure. Thus, as outlined above, a composition and process capable of forming an electrically insulating thin film with a low dielectric constant, for example, with a dielectric constant materially below 2.7, have remained unknown to date.

It is an object of this invention is to provide a composition and process that can produce electrically insulating thin films with low dielectric constants.

SUMMARY OF THE INVENTION

This invention pertains to an insulating thin film-forming composition comprising (A) an electrically insulating curable resin selected from the group consisting of electrically insulating curable inorganic resins and electrically insulating curable organic resins, (B) solvent; and (C) at least 1 solvent-soluble substance (excluding the solvent used for component (B)) that upon heating or by interaction with the resin (A) can generate gas or undergo volatilization in the temperature range from 0° C. to 800° C.

DETAILED DESCRIPTION OF THE INVENTION

The insulating thin film-forming composition comprises (A) electrically insulating curable inorganic or organic resin, (B) solvent, and (C) at least 1 solvent-soluble substance (excluding the solvent used for component (B)) that upon heating or by interaction with the resin (A) can generate gas or undergo volatilization in the temperature range from 0° C. to 800° C.

The resin (A) can be inorganic or organic and is not critical as long as it is solvent soluble, can be cured by heating after its application, and provides insulation. The resin can be exemplified by the partial hydrolyzates of alkoxysilanes, by inorganic resins such as silica precursor resins, e.g., hydrogen silsesquioxane resin; and by polyimide resins, fluorocarbon resins, benzocyclobutene resins, and fluorinated polyallyl ethers. This resin can take the form of a single resin or a mixture of two or more resins. Resins that cure into silica are preferred for the particularly good electrical insulating properties afforded thereby. Among the silica precursor resins, hydrogen silsesquioxane resins, which can be used in a non-etchback process, are particularly preferred.

The hydrogen silsesquioxane resin used in the present invention is polysiloxane whose main skeleton is composed of the trifunctional siloxane unit $HSiO_{3/2}$ and is a polymer with the general formula $(HSiO_{3/2})_n$ in which the subscript n is an integer. From the standpoint of molecular structure, this hydrogen silsesquioxane resin includes so-called ladder-type polysiloxanes and cage-type polysiloxanes. The terminals of the ladder-type polysiloxanes can be endblocked by, for example, the hydroxyl group, a triorganosiloxy group such as the trimethylsiloxy group, or a diorganohydrogensiloxy group such as the dimethylhydrogensiloxy group.

Methods for the preparation of hydrogen silsesquioxane resin are in fact known and in general involve the hydrolysis of trichlorosilane and ensuing polycondensation (see U.S. Pat. No. 3,615,272, and Japanese Patent Application Laid Open (Kokai or Unexamined) Numbers Sho 59-189126 (189,126/1984) and Sho 60-42426 (42,426/1985)).

The solvent (B) used in the present invention should be capable of dissolving resin (A) without inducing chemical changes therein, but is not otherwise critical. Usable solvents are exemplified by aromatic solvents such as toluene, xylene, and so forth; aliphatic solvents such as hexane, heptane, octane, and so forth; ketone solvents such as methyl ethyl ketone, methyl isobutyl ketone, and so forth; aliphatic ester solvents such as butyl acetate, isoamyl acetate, and so forth; and silicone solvents such as chain methylsiloxanes like hexamethyldisiloxane and 1,1,3,3-tetramethyldisiloxane, cyclic siloxanes like 1,1,3,3,5,5,7,7-octamethyltetracyclosiloxane and 1,3,5,7-tetramethyltetracyclosiloxane, and silanes such as tetramethylsilane and dimethyldiethylsilane. Methyl isobutyl ketone and the silicone solvents are preferred. This solvent may take the form of a single solvent or a mixture of two or more solvents.

Component (C) functions to lower the dielectric constant of the electrically insulating thin film. Component (C) exercises this function by generating gas or undergoing volatilization—preferably also with expulsion from the system—during or after the cure of resin (A). This gas generation or volatilization is induced by heating or interaction with the resin (A). The effect of this gas generation or volatilization, preferably also with expulsion from the system, is to leave voids or free spaces in the electrically insulating thin film and thereby lower the dielectric constant of the insulating thin film. The temperature at which gas is generated from component (C) must be compatible with the process for forming electrically insulating thin films and will be in the range from 0° C. to 800° C. and is preferably from 25° C. to 400° C. Since the majority of the solvent evaporates immediately after coating on the substrate and gas generation from component (C) preferably occurs subsequent to this, the onset temperature for gas generation from component (C) is preferably higher than the boiling point of the solvent (B).

Volatilizing substances encompassed by component (C) are exemplified by, but not limited to, organic solids such as biphenyl, naphthalene, anthracene, and the like, and by oils such as silicone oils and the like. When hydrogen silsesquioxane resin is used as the resin (A), silicone oil is preferred based on compatibility considerations.

Components that generate gas by their own decomposition are exemplified by, but not limited to, organic peroxides such as benzoyl peroxide and the like.

Components that generate gas by interaction with the resin can be exemplified by amines, e.g., N,N,N',N'-tetramethyl-1,6-hexanediamine, when the resin contains SiH, in which case hydrogen gas is generated.

Component (D) is used on an optional basis when it becomes necessary to preliminarily induce a partial crosslinking of resin (A) at relatively lower temperatures. When hydrogen silsesquioxane resin is used as (A), component (D) is preferably a platinum catalyst such as chloroplatinic acid or a rhodium catalyst. These catalysts are generally used at from 1 to 500 weight parts for each 1,000,000 weight parts resin (A). In addition, depending on the particular circumstances, an assistant, e.g. a stabilizer such as surfactant, may be present in the composition to assist the dispersion of component (C).

When hydrogen silsesquioxane resin is used as (A), heating the composition results in the formation of an electrically insulating thin film, for example, a silica thin film. As used herein, silica refers to silicon dioxide ($SiO_2$) and includes both amorphous silica and amorphous silica that is not completely free of silanol and/or hydrogen. In the event of the addition of ceramic precursors, the silica will also contain the corresponding compounds.

Substrates that may be used in the process according to the present invention are exemplified by ceramic substrates, various metal substrates, and electronic devices, preferably electronic devices.

One process for forming electrically insulating thin films comprises (I) coating the surface of a substrate with an insulating thin film-forming composition comprising
 (A) an electrically insulating curable inorganic or organic resin,
 (B) a solvent, and
 (C) at least 1 solvent-soluble substance, excluding the solvent used for component (B), that upon heating or by interaction with the resin (A) can generate gas or undergo volatilization in the temperature range from 0° C. to 800° C.;
(II) evaporating the solvent (B); and
(III) subsequently heating the substrate in order to generate gas from component (C) during the course of or after the cure of the said resin (A).

In this process the insulating thin film-forming composition comprising components (A) to (C) is coated on the surface of a substrate, the solvent (B) is then evaporated, and the substrate is thereafter heated in order to generate gas from component (C) during the course of or after the cure of the resin (A). Applicable coating methods are exemplified by spin coating, dipping, spraying, and flow coating.

The technique for evaporating solvent (B) is not critical and can be exemplified by standing at ambient or elevated temperature and drying in air, under reduced pressure, or under a gas current. Drying time is ordinarily not necessary when spin coating is used as the coating technique since the solvent is expelled during the rotation.

The heating temperature is not critical as long as a temperature is used that can induce gasification of component (C). However, heating must be carried out to a temperature higher than the melting point of resin (A) when it is desired for the electrically insulating thin film to melt planarize the substrate. The means used for this heating is again not crucial, and the generally known heaters, such as ovens, hot plates, and so forth, can be used in the instant invention.

In this process, component (C) is gasified and a portion thereof is expelled from the system, which results in the corresponding formation of voids and porous structures or free space in the electrically insulating thin film.

Another process for forming electrically insulating thin films comprises (I) coating the surface of a substrate with an insulating thin film-forming composition comprising
 (A) an electrically insulating curable inorganic or organic resin,
 (B) a solvent, and
 (C) at least 1 solvent-soluble substance, excluding the solvent used for component (B), that upon heating or by interaction with the resin (A) can generate gas or undergo volatilization in the temperature range from 0° C. to 800° C.;
(II) evaporating the solvent (B);
(III) subsequently heating the substrate and effecting a partial cure of the resin (A) at a temperature lower than the temperature that would provide an exhaustive gas generation from component (C); and
(IV) thereafter completing gas generation from component (C).

This process comprises coating a substrate with the insulating thin film-forming composition comprising the components (A) to (C) as described above, subsequently evaporating the solvent (B), and thereafter heating the substrate. The methodologies for effecting evaporation of the solvent and for heating can be the same in this process as in the first process, above.

The resin (A) is then partially cured at a temperature below that which would cause an exhaustive or complete generation of gas from component (C). This step is followed by the completion of gas generation from component (C). Methods for inducing this partial cure of the resin (A) include standing for a prescribed period of time at a temperature at which component (A) will cure, exposure to ultraviolet radiation or electron beam, and so forth. Gas generation from component (C) can be completed, for example, by heating the substrate under reduced pressure.

The insulating thin film-forming composition has the ability to cure into low-dielectric constant insulating thin films and as a consequence is useful for those applications that require such properties. The composition according to the present invention is particularly useful for the formation of interlayer insulating thin films in semiconductor devices.

EXAMPLES

So that those skilled in the art can understand and appreciate the invention taught herein, the following examples are presented, it being understood that these examples should not be used to limit the scope of this invention found in the claims.

The conversion to silica was evaluated by measuring the residual SiH % in the film using Fourier transform infrared absorption spectroscopic analysis. The residual SiH % in the film was calculated using 100% for the quantity of SiH after spin coating.

The dielectric constant was measured at 25° C. and 1 megahertz on a sample formed on a silicon wafer with a resistivity of $10^{-2}$ Ω·cm. The measurement was run by the sandwich method using aluminum electrodes and an impedance analyzer.

Example 1

Hydrogen silsesquioxane resin was synthesized by the method described in Example 1 of Japanese Patent Publication (Kokoku) Number Sho 47-31838 (U.S. Pat. No. 3,615,272). Analysis of the hydrogen silsesquioxane resin product by gel permeation chromatography (GPC) gave a number-average molecular weight of 1,540 and a weight-average molecular weight of 7,705. The hydrogen silsesquioxane resin was subjected to a molecular weight fractionation according to the method described in Example 1 of Japanese Patent Application Laid Open (Kokai or Unexamined) Number Hei 6-157760 (157,760/1994) (U.S. Pat. No. 5,416,190). Analysis of the hydrogen silsesquioxane resin in the recovered fraction ("H-resin fraction") by GPC gave a number-average molecular weight of 5,830 and a weight-average molecular weight of 11,200. The conditions in the GPC measurements were:

instrument: 802A from the Tosoh Corporation
column: G3000/G4000/G5000/G6000
carrier solvent: toluene
column temperature: 30° C.
molecular weight standard: polystyrene
detection: differential refractometer
sample: 2 weight % solids (toluene solution)

The H-resin fraction was dissolved in methyl isobutyl ketone to prepare the 22 weight % (solids) solution. To this was added biphenyl at 10 weight % based on the methyl isobutyl ketone solution and also chloroplatinic acid hexahydrate at 100 weight-ppm based on the H-resin fraction. A film with a thickness of 6,400 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 250° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH % in the film was 78%, confirming that conversion to silica had occurred. No abnormalities, i.e., cracks and so forth, were observed in the film. The dielectric constant of this silica thin film was 2.4.

Example 2

The fraction prepared in Example 1 was dissolved in methyl isobutyl ketone to prepare the 22 weight % (solids) solution. To this was added N,N,N',N'-tetramethyl-1,6-hexanediamine at 10 weight-ppm based on the methyl isobutyl ketone solution. Immediately after its preparation this solution was spin coated on a silicon wafer at a preliminary rotation of 500 rpm for 3 seconds and then at a main rotation of 3,000 rpm for 10 seconds. At this point the film exhibited a low solubility in methyl isobutyl ketone. Standing at room temperature for 10 minutes gave a film with a thickness of 6,110 angstroms. The wafer was baked in a quartz oven under an air current at 100° C. for 1 hour, removed, and allowed to stand for 10 minutes at room temperature. At this point the film exhibited almost no solubility in methyl isobutyl ketone. The wafer was thereafter annealed for 1 hour in a quartz oven at 400° C. under a current of nitrogen containing 10 ppm oxygen, withdrawn and allowed to stand at room temperature for 10 minutes. The residual SiH % in the film was 32%, confirming that conversion to silica had occurred. No abnormalities, i.e., cracks and so forth, were observed in the film. The dielectric constant of this silica thin film was 2.4.

Example 3

The H-resin fraction prepared in Example 1 was dissolved in methyl isobutyl ketone to prepare the 22 weight % (solids) solution. To this was added benzoyl peroxide at 50 weight-ppm based on the methyl isobutyl ketone solution. A film with a thickness of 6,100 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was baked in a quartz oven under an air current at 150° C. for 1 hour, removed, and allowed to stand for 10 minutes at room temperature. At this point the solubility of the film in methyl isobutyl ketone was lower than that post-spin coating. The wafer was annealed for 1 hour in a quartz oven at 400° C. under a current of nitrogen containing 10 ppm oxygen, withdrawn and allowed to stand at room temperature for 10 minutes. The residual SiH % in the film was 41%, confirming that conversion to silica had occurred. No abnormalities, i.e., cracks and so forth, were observed in the film. The dielectric constant of this silica thin film was 2.4.

Example 4

A fluorinated polyallyl ether resin was synthesized according to the method described on page 116 of the 1995 Proceedings of the Twelfth International VLSI Multilevel Interconnection Conference. Analysis of the resin product by GPC gave a number-average molecular weight of 2,540 and a weight-average molecular weight of 9,390. This resin was dissolved in methyl isobutyl ketone to prepare the 26 weight % (solids) solution. To this was added biphenyl at 10 weight % based on the methyl isobutyl ketone solution. A film with a thickness of 6,120 angstroms was prepared by spin coating the solution on a silicon wafer at a preliminary rotation of 500 rpm for 3 seconds and then at a main rotation of 3,000 rpm for 10 seconds followed by standing for 10 minutes at room temperature. The wafer was baked for 1 hour at 250° C. in a quartz oven under an air current, removed, and allowed to stand at room temperature for 10 minutes. At this point the solubility of the film in methyl isobutyl ketone was less than that post-spin coating. The wafer was annealed at 400° C. for 1 hour in a quartz oven under a current of nitrogen containing 10 ppm oxygen, withdrawn and held at room temperature for 10 minutes. The solubility of the film in methyl isobutyl ketone was found to have undergone further decline. The film had a dielectric constant of 2.4.

Comparative Example 1

The H-resin fraction prepared in Example 1 was dissolved in methyl isobutyl ketone to prepare the 22 weight % (solids) solution. A film with a thickness of 6,078 angstroms was produced by spin coating the solution on a silicon wafer at a preliminary rotation of 500 rpm for 3 seconds and then at a main rotation of 3,000 rpm for 10 seconds followed by standing for 10 minutes at room temperature. The wafer was annealed for 1 hour at 400° C. in a quartz oven under a current of nitrogen containing 10 ppm oxygen, withdrawn and held for 10 minutes at room temperature. The residual SiH % in the film was 75%, confirming that conversion to silica had occurred. The production of cracks in the film was observed. The dielectric constant of this silica thin film was 2.8.

Comparative Example 2

The H-resin fraction prepared in Example 1 was dissolved in methyl isobutyl ketone to prepare the 35 weight % (solids) solution. A film with a thickness of 13,200 angstroms was produced by spin coating the solution on a silicon wafer at a preliminary rotation of 500 rpm for 3 seconds and then at a main rotation of 2,000 rpm for 10 seconds followed by standing for 10 minutes at room temperature. The wafer was annealed for 1 hour at 400° C. in a quartz oven under a current of nitrogen containing 10 ppm oxygen, withdrawn and held for 10 minutes at room temperature. The residual SiH % in the film was 75%, confirming that conversion to silica had occurred. The production of cracks in the film was observed. The dielectric constant of this silica thin film was 2.8.

What is claimed is:

1. A composition for forming electrically insulating thin films comprising
   (A) an electrically insulating curable resin selected from electrically insulating curable inorganic resins or electrically insulating curable organic resins,
   (B) solvent, and
   (C) at least one solvent-soluble substance selected from
      (i) substances that upon heating at a temperature of from 0° C. to 800° C. generate a gas;
      (ii) substances that by interaction with resin (A) generate a gas or
      (iii) substances that undergo volatilization at a temperature in the range from 0° C. to 800° C.

2. The composition as claimed in claim 1 wherein resin (A) is hydrogen silsesquioxane resin.

3. The composition as claimed in claim 1 wherein the solvent is selected from the group consisting of aromatic solvents; aliphatic solvents; ketone solvents; aliphatic ester solvents; silicone solvents and silanes.

4. The composition as claimed in claim 1 wherein the solvent (B) is a ketone solvent.

5. The composition as claimed in claim 4 wherein the solvent is methyl isobutyl ketone.

6. The composition as claimed in claim 1 wherein the solvent is a silicone solvent.

7. A composition as claimed in claim 1 that additionally comprises (D) a cure-accelerating catalyst.

8. A composition as claimed in claim 4 wherein (D) is selected from a platinum compound or transition metal compound.

9. The composition as claimed in claim 1 wherein component (C) is (i) a substance that upon heating at a temperature of from 0° C. to 800° C. generates a gas.

10. The composition as claimed in claim 9 wherein component (C) is an organic peroxide.

11. The composition as claimed in claim 1 wherein component (C) is (ii) a substance that by interaction with resin (A) generates a gas.

12. The composition as claimed in claim 11 wherein resin (A) is hydrogen silsesquioxane resin and component (C) is an amine.

13. The composition as claimed in claim 1 wherein component (C) is (iii) a substance that undergoes volatilization at a temperature in the range from 0° C. to 800° C.

14. The composition as claimed in claim 13 wherein component (C) is selected from the group consisting of biphenyl, naphthalene, anthracene and silicone oils.

15. A process for forming electrically insulating thin films comprising
   (I) coating the surface of a substrate with an insulating thin film-forming composition comprising
      (A) an electrically insulating curable resin selected from electrically insulating curable inorganic resins or electrically insulating curable organic resins,
      (B) solvent, and
      (C) at least one solvent-soluble substance selected from
         (i) substances that upon heating at a temperature of from 0° C. to 800° C. generate a gas;
         (ii) substances that by interaction with resin (A) generate a gas or
         (iii) substances that undergo volatilization at a temperature in the range from 0° C. to 800° C.;
   (II) evaporating the solvent (B); and
   (III) subsequently heating the substrate in order to generate gas from component (C) during the course of or after the cure of the said resin (A).

16. The process as claimed in claim 15 wherein the substrate is an electronic device.

17. The process as claimed in claim 15 wherein the resin (A) is hydrogen silsesquioxane resin.

18. A process for forming electrically insulating thin films comprising
   (I) coating the surface of a substrate with an insulating thin film-forming composition comprising
      (A) an electrically insulating curable inorganic or organic resin,
      (B) a solvent, and
      (C) at least 1 solvent-soluble substance, excluding the solvent used for component (B), that upon heating or by interaction with the resin (A) can generate gas or undergo volatilization in the temperature range from 0° C. to 800° C.;
   (II) evaporating the solvent (B);
   (III) subsequently heating the substrate and effecting a partial cure of the resin (A) at a temperature lower than the temperature that would provide an exhaustive gas generation from component (C); and
   (IV) thereafter completing gas generation from component (C).

19. The process as claimed in claim 18 wherein the substrate is an electronic device.

20. The process as claimed in claim 18 wherein the resin (A) is hydrogen silsesquioxane resin.

* * * * *